(12) United States Patent
Court et al.

(10) Patent No.: US 6,813,599 B1
(45) Date of Patent: Nov. 2, 2004

(54) EFFICIENT MEMORY STRUCTURE SIMULATION FOR SEQUENTIAL CIRCUIT DESIGN VERIFICATION

(75) Inventors: Thomas Court, Eau Claire, WI (US); Abdulla Bataineh, Eau Claire, WI (US); Dennis Kuba, Chippewa Falls, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 613 days.

(21) Appl. No.: 09/617,367

(22) Filed: Jul. 17, 2000

(51) Int. Cl.[7] .............................................. G06F 17/50
(52) U.S. Cl. ........................................ 703/14; 703/20
(58) Field of Search .............................. 703/14, 16, 17, 703/21, 20; 716/16, 17, 4; 714/726

(56) References Cited

U.S. PATENT DOCUMENTS

| | | | | |
|---|---|---|---|---|
| 5,053,980 A | * | 10/1991 | Kanazawa | 364/578 |
| 5,325,309 A | * | 6/1994 | Halaviati et al. | 364/488 |
| 5,426,768 A | * | 6/1995 | Kanazawa | 395/500 |
| 5,862,361 A | * | 1/1999 | Jain | 395/500 |
| 5,884,066 A | * | 3/1999 | Kuijsten | 395/500 |
| 5,954,824 A | * | 9/1999 | Cherichetti et al. | 714/28 |
| 5,960,188 A | * | 9/1999 | Linke et al. | 395/500.35 |
| 6,081,864 A | * | 6/2000 | Lowe et al. | 710/129 |
| 6,138,266 A | * | 10/2000 | Ganesan et al. | 716/5 |
| 6,622,182 B1 | * | 9/2003 | Miller et al. | 710/29 |

* cited by examiner

*Primary Examiner*—Thai Phan
(74) *Attorney, Agent, or Firm*—Baker Botts L.L.P.

(57) ABSTRACT

A method for efficiently simulating memory structures of a sequential circuit for design verification of the sequential circuit. The method is implemented by an computer system having a processor coupled to a memory via a bus, the memory storing computer readable code which when executed by the processor cause the computer system to perform the steps of the memory structure simulation method. The method includes accessing a netlist description of a sequential circuit, wherein the description is for realizing the sequential circuit in a physical form. Memory elements included within the description are identified. For these memory elements, inputs to the memory elements and outputs from the memory elements are identified. Using this information, the memory elements are grouped into at least one group of functionally related memory elements. Subsequently, the memory elements of the one or more groups are collectively addressed as a group. Similarly, data for the memory elements of the one or more groups are collectively written as a group. Once written, the data is coupled to circuit elements within the description that are coupled to the outputs of the memory elements such that the memory elements are efficiently simulated group-wise, as opposed being simulated individually. In so doing, a more efficient method and system for design verification for sequential circuits is implemented.

10 Claims, 3 Drawing Sheets

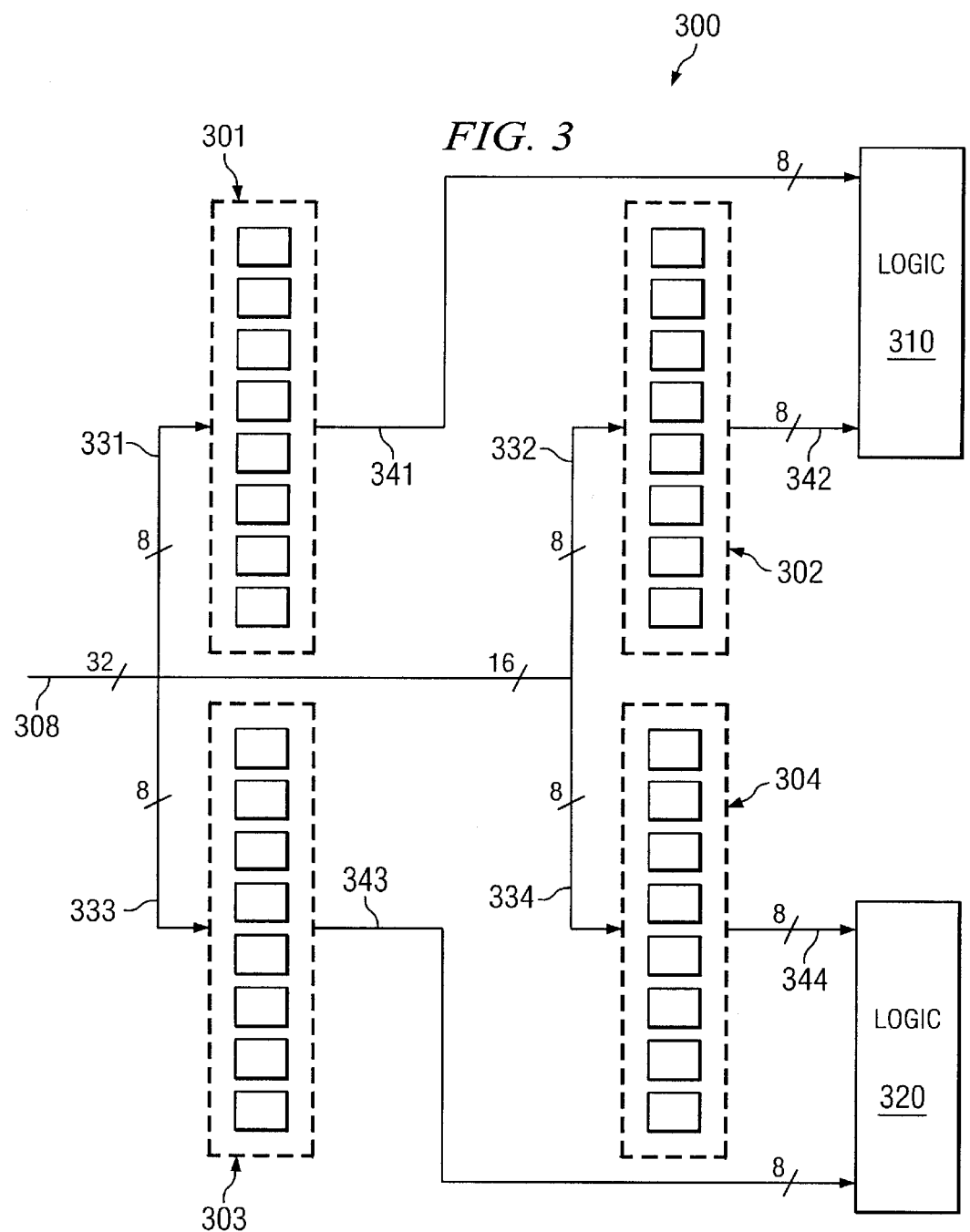

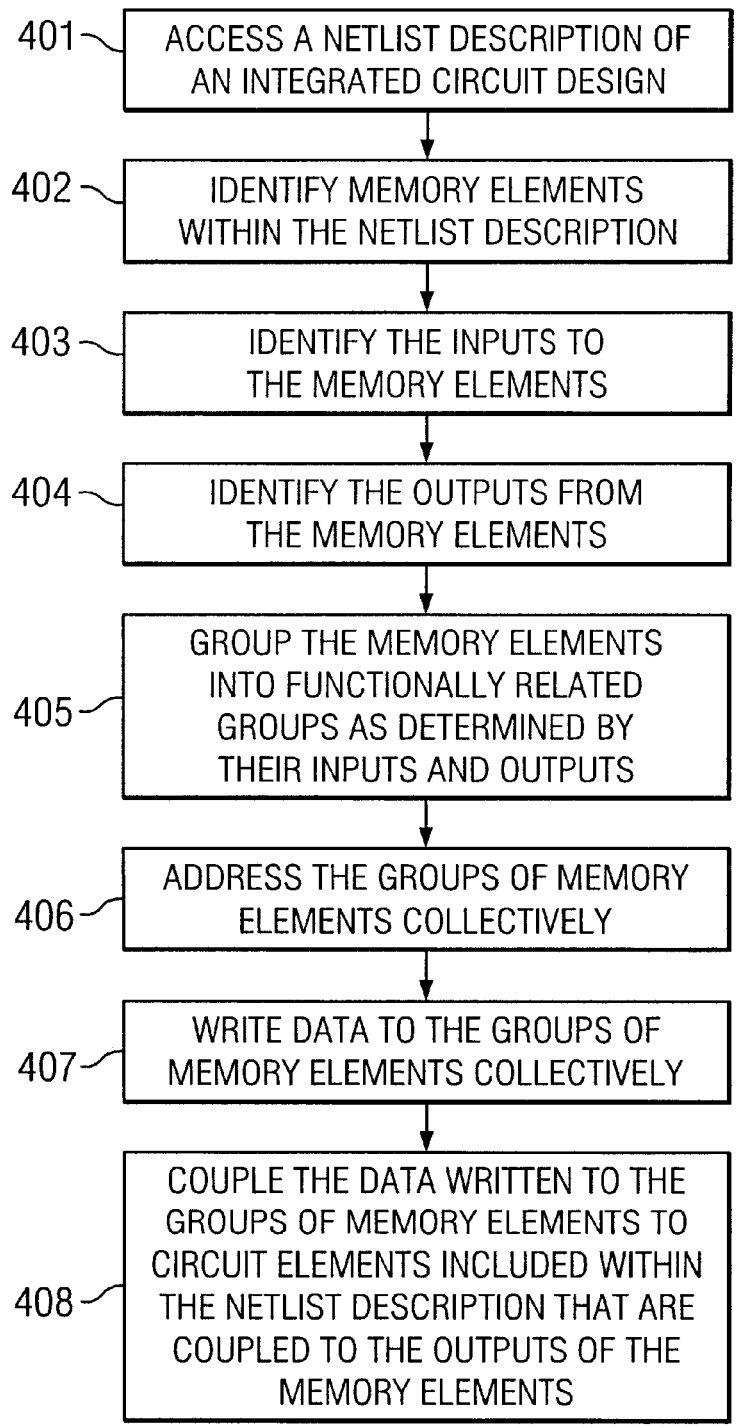

EFFICIENT MEMORY STRUCTURE SIMULATION FOR SEQUENTIAL CIRCUIT DESIGN VERIFICATION

FIELD OF THE INVENTION

The present invention relates to the field of electronic design automation (EDA). More specifically, the present invention relates to the verification of integrated circuit designs using computer aided design (CAD) tools.

BACKGROUND ART

Rapid growth in the complexity of modern electronic circuits has forced electronic circuit designers to rely upon computer programs to assist and automate most steps of the integrated circuit design process. Typical circuits today contain hundreds of thousands or millions of individual pieces or "cells." These designs are much too large for a circuit designer or even an engineering team of designers to manage effectively manually. To automate the design and fabrication of integrated circuit devices, the field of electronic design automation (EDA) has been developed which uses computer aided design (CAD) tools and systems.

Typically, CAD tools function in part by decomposing the overall desired behavior of the integrated circuit into simpler functions which can be represented as functional cells by the CAD tool. The CAD tool generates netlists including cells, logic gates and connections between them which perform the desired circuit behavior. Netlists can represent the integrated circuit in different levels of abstraction depending on the CAD function being performed, such as the behavior level, the structural level and the gate level. The behavioral level hardware description language (HDL) netlist is typically the starting level for CAD tools because the HDL description file describes the behavior of the integrated circuit. The gate level HDL netlist is usually the level at which the functional verification of the integrated circuit is performed.

Achieving the desired degree of reliability in a complex integrated circuit thus depends upon being able to analyze the circuit's HDL design early in the design process. In so doing, the consequences of design choices and trade-offs can be explored and tested prior to design implementation, and potentially disastrous flaws can be detected and remedied while their cost of repair is still relatively inexpensive. For example, detecting a flaw in a microprocessor design prior to its mass fabrication is much more desirable and much more economical than correcting the consequences of the flaw after the microprocessor has been deployed in systems throughout the world. Such testing is commonly referred to as design verification. Computer engineers and other designers of complex systems use numerous EDA tools to aid in design verification and debugging.

The extensive use of EDA tools have given rise to modern integrated circuit devices having greater and greater densities. The higher densities are greatly increasing the costs associated with verifying the designs of such devices. The problem of performing design verification on complex integrated circuit devices includes problems related to the devising of sufficiently accurate tests that adequately ensure the complete functionality of the devices. For example, as the complexity of an integrated circuit design increases (e.g., the total number of logic gates increases and the total number of storage elements increases), the total number of possible states of the design increases. The increasing number of possible states causes a geometric increase in the amount of processing power (e.g., CPU cycles) required to run the design verification EDA tools (e.g., simulators, ATPG programs, etc.).

To verify a given complex integrated circuit design, the designer will use an EDA simulation tool to examine the possible states of a representative simulation of the integrated circuit (e.g., a state machine, etc.) and examine the transitions between the states to determine whether the circuit can achieve all of its "desired states" and determine whether the circuit successfully avoids all "illegal states". A desired state may represent, for example, correctly calculating a desired result. An illegal state may represent, for example, and error condition which results in system malfunction.

This design verification involves the simulation of those components within the design that store state information. Each memory element within the integrated circuit design stores state information, and hence, needs to be accurately simulated. The goal of the design verification is to simulate the memory elements to compute the set of all reachable states from an initial state of a integrated circuit design, and to use this information to verify the behavior and internal configuration of the design.

There is a problem, however, when the size of the integrated circuit design becomes quite large. Large complex integrated circuit designs, including a large number of memory elements, can result in a simulation (e.g., a finite state machine) having an unmanageably large number of possible states. For example a modern microprocessor often processes information in data words of up to 64 bits in one cycle. This results in a very large number of inputs and outputs per state, and a very large number of state transitions, and thus an extremely large number of possible states, requiring the accurate simulation of each memory element. The large number of memory elements require an very large amount of processor time to update within the simulation.

Thus, what is required is a more efficient method and system for design verification for complex integrated circuits having a very large number of possible states. What is required is an efficient method and system for simulating an integrated circuit having a large number of memory elements. What is required is a system which can efficiently process and update the memory elements of a simulation of an integrated circuit. The present invention provides a novel solution to the above requirements.

SUMMARY OF THE INVENTION

The present invention provides an efficient method and system for design verification for complex integrated circuits having a very large number of possible states. The present invention provides an efficient method and system for simulating an integrated circuit having a large number of memory elements. Additionally, the present invention provides a system which can efficiently process and update the memory elements of a simulation of an integrated circuit.

In one embodiment, the present invention is implemented as a software based EDA process for efficiently simulating memory structures of a sequential circuit for design verification of the sequential circuit. The process is implemented within the context of an EDA computer system used for simulating the operation of complex integrated circuit devices. The process includes accessing an HDL netlist description of the sequential circuit. In this embodiment, a gate level netlist description is used for the verification. Memory elements included within the netlist description are identified. For these memory elements, inputs to the memory elements and outputs from the memory elements are identified. Using this information, the memory elements are grouped into at least one group of functionally related memory elements. Subsequently, the memory elements of the one or more groups are collectively addressed as a group. Similarly, data for the memory elements of the one or more groups are collectively written as a group. Once written, the data is coupled to circuit elements within the description that are coupled to the outputs of the memory elements such that the memory elements are efficiently.simulated group-wise, as opposed being simulated individually.

In so doing, a more efficient process and system for design verification for sequential circuits is implemented. For those circuits having a very large number of memory elements, the simulation process of the present invention provides a significant savings in the amount of processing time (e.g., CPU cycles) required to run the simulation. Accordingly, using the simulation process of the present invention, even those circuits having a very large number of possible states can be simulated, and the design of the circuits can be accurately verified within reasonable time constraints.

BRIEF DESCRIPTION OF THE DRAWINGS

The present invention is illustrated by way of example and not by way of limitation, in the figures of the accompanying drawings and in which like reference numerals refer to similar elements and in which:

FIG. 3 shows a diagram of a memory structure of a circuit for simulation by a simulation process in accordance with one embodiment of the present invention.

FIG. 4 shows a flow chart of the steps of a memory structure simulation process in accordance with one embodiment of the present invention.

DETAILED DESCRIPTION OF THE INVENTION

Reference will now be made in detail to the embodiments of the invention, efficient memory structure simulation for sequential circuit design verification, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Figure 1:
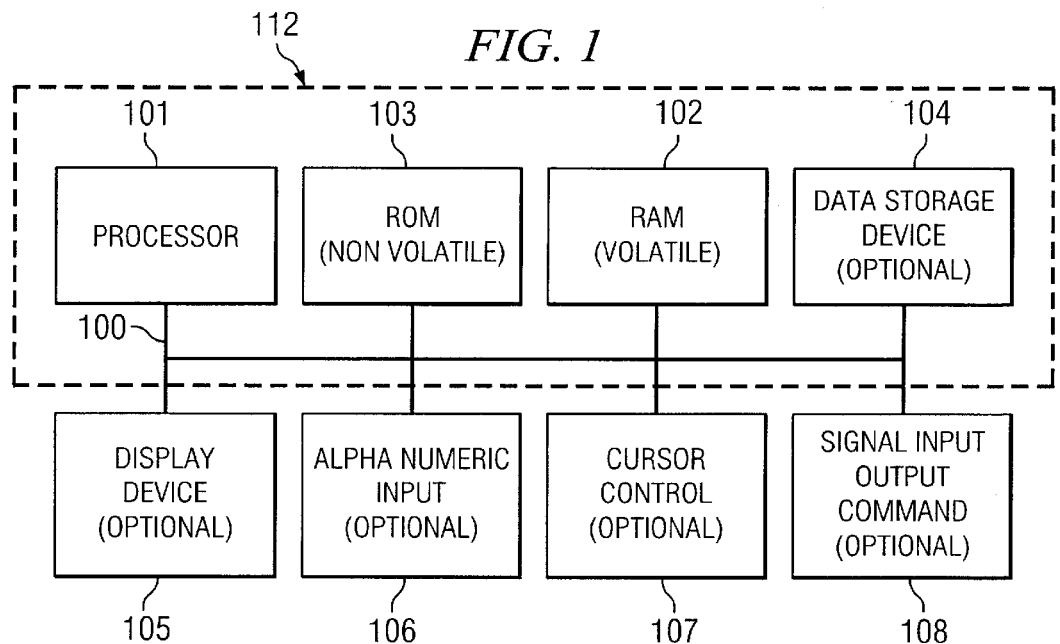
FIG. 1 shows a diagram of a computer system platform in accordance with one embodiment of the present invention.

The present invention provides an efficient method and system for design verification for complex integrated circuits having a very large number of possible states. The present invention provides an efficient method and system for simulating an integrated circuit having a large number of memory elements. Additionally, the present invention provides a system which can efficiently process and update the memory elements of a simulation of an integrated circuit. In one embodiment, the present invention is implemented as software based process for the efficient simulation of memory structures of an HDL netlist description of an integrated circuit design and is implemented within a computer-based EDA synthesis system. A general configuration of the computer system platform for an EDA system in accordance with the present invention is shown in FIG. 1 below.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "examining," "instantiating," "determining," "identifying," "grouping," or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

Computer System Environment

Referring to FIG. 1, a computer system 112 is illustrated. The memory structure simulation process of the present invention is implemented within a computer-based EDA synthesis system such as computer system 112. Within the following discussions of the present invention, certain processes and steps are discussed that are realized, in one embodiment, as a series of instructions (e.g., software program) that reside within computer readable memory units of system 112 and executed by processors of system 112. When executed, the instructions cause computer system 112 to perform specific actions and exhibit specific behavior which is described in detail to follow.

Specific aspects of the present invention are operable within a programmed computer aided design (CAD) system, or similar element in an electronic design automation (EDA) system. A CAD system operable to implement the elements of the present invention is shown in FIG. 1. In general, the CAD system of the present invention includes an address/ data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc. to and from processor(s) 101.

Program instructions executed by the CAD system can be stored in RAM 102, ROM 103, or in the storage device 104 and when executed in a group can be referred to as logic blocks or procedures. It is appreciated that data produced at the various logic synthesis stages of the present invention, including representations of the different levels of abstraction of the integrated circuit design, can also be stored in RAM 102, ROM 103 or the storage device 104 as shown in FIG. 1.

The display device 105 of FIG. 1 utilized with the computer system 112 of the present invention may be a liquid crystal device, cathode ray tube, or other display device suitable for creating graphic images and alphanumeric characters recognizable to the user. The cursor control device 107 allows the computer user to dynamically signal the two dimensional movement of a visible pointer on a display screen of the display device 105. Many implementations of the cursor control device are known in the art including a trackball, mouse, joystick or special keys on the alphanumeric input device 105 capable of signaling movement of a given direction or manner of displacement.

The Simulation Process of the Present Invention

The present invention provides an efficient method and system for design verification for complex integrated circuits having a very large number of memory elements. The present invention efficiently simulates large numbers of memory elements within integrated circuit designs. Modern high-performance integrated circuits are growing larger and larger. When the designs of such circuits become very large, they place an inordinate burden on verification and analysis tools which try to process them. In particular, the tools require increasingly large amounts of computer memory and CPU time to process the circuits in their entirety.

Embodiments of the present invention perform verification analysis on large complex integrated circuits in part, by efficiently tracking and updating the state of memory elements included within the integrated circuits using an efficient memory structure simulation process. The memory structure simulation process functions as one part of an overall logic synthesis and verification process.

Figure 2:
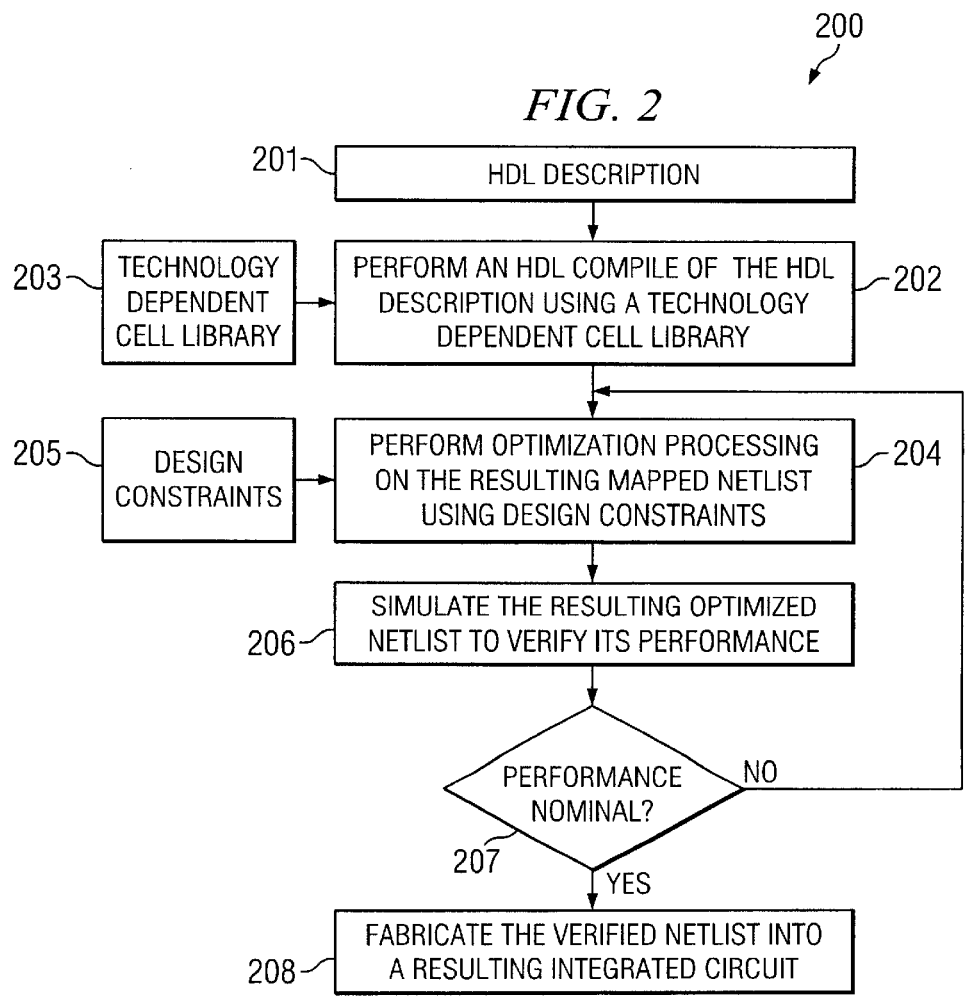
FIG. 2 shows a flow chart of the steps of an overall logic synthesis and verification process in accordance with one embodiment of the present invention.

FIG. 2 shows a flow chart diagram of showing the overall steps of a logic synthesis and verification process 200 in accordance with the present invention. Process 200 is implemented in a CAD environment within a computer system platform, such as, for example, computer system 112 of FIG. 1. Process 200 begins in step 201, where an HDL description of the integrated circuit is received (e.g., from a design specification). In step 202, the HDL description is compiled by a specialized HDL compiler tool. The compiler (also called an HDL compiler, RTL synthesizer, or architectural optimizer) inputs the HDL 201 description and compiles this description using logic and mapping procedures which interface with a technology dependent cell library 203 (e.g., from LSI, VLSI, TI or Xilinx technologies, etc.). The cell library 203 contains specific information regarding the cells of the specific technology selected such as the cell logic, number of gates, area consumption, memory timing criteria, pin descriptions, etc., for each cell in the library 203. The compiling procedure of block 202 ultimately generates a gate level mapped netlist that is technology dependent and has cells specifically selected in accordance with a particular manufacturing technology (e.g., CMOS).

In step 204, the compiler then performs optimization processing the resulting mapped netlist from step 202. The optimization processing is performed using a set of design constraints 205. The gate level netlist received from step 202 is processed in light of the design constraints 205. Design constraints 205 include the memory timing constraints for the design, along with other design constraints, such as, for example, combinational logic timing, silicon area, and other performance related limitations. The compiler then attempts to satisfy these constraints by altering the mapped netlist generated in step 202. Design constraints 205 can also include non-performance related constraints such as structural and routing constraints.

Referring still to step 204 of FIG. 2, simulation of the netlist in view of the constraints is used to guide the optimization and mapping of a design towards feasible realization in terms of memory access timing, area, performance, costs, testability, and other physical limitations. The constraints provide the goals for the optimization and synthesis tools to achieve. Power consumption and performance constraints are the two most common constraints. For example, for behavioral synthesis, the area constraints are usually specified at the architectural level where a designer specifies the number of function units, registers, and busses to be used on the RTL structure, while timing constraints are specified as the expected clock frequency of each clock signal.

Technology libraries 203 and design constraints 205 typically contain all the information needed by the synthesis tool to make correct choices in building the structure of the integrated circuit. They contain descriptions of the behavior of a cell and information such as the area of the cell, the timing of the cell, the capacitance loading of the cell, the rise and fall delay values for the basic cells, etc. The objective of the optimization process is to generate the most efficient detailed layout of the integrated circuit possible, while satisfying the design constraints (e.g., power consumption) to the greatest degree possible.

Subsequently, in step 206, the resulting optimized netlist is simulated with respect to objective performance parameters to verify its performance. The optimized netlist is loaded into a simulation tool and the operation of the circuit is simulated through a successive series of clock cycles. The simulation is provided with inputs at its various primary and secondary circuit inputs representative of those inputs likely to be seen during normal operation. Additionally, the simulation is run through scenarios and input combinations that most vigorously exercise the functional aspects of the circuit. The goal of the verification simulation is to objectively verify the resulting integrated circuit will be free of design errors and will perform as specified.

In step 207, if the optimized netlist performs as desired, the resulting verified netlist proceeds to subsequent fabrication processing and is fabricated into a resulting integrate circuit, as shown in step 208. However, should performance of the optimized netlist prove substandard, additional optimization processing and simulation is performed until the netlist can be verified.

The memory structure simulation process of the present invention is used to increase the efficiency of the verification simulation process of step 206. As described above, the circuit represented by the optimized netlist is simulated using a simulation tool in accordance with one embodiment of the present invention. The elements of the circuit (e.g., logic elements, memory elements, etc.) are simulated through several clock cycles. Hence, as described above, the memory elements of the circuit need to be updated accordingly, on each clock cycle. The memory structure simulation process of the present invention greatly speeds the simulation process.

It should be noted that the optimization process of step 204 also uses a simulation process to evaluate the suitability of various optimization alternatives. As circuit optimization changes are provisionally implemented, the circuit is simulated to evaluate and quantify the effect of the changes. Based upon the evaluation, certain optimizations are selected for implementation over others. The evaluation requires that certain aspects of the circuit be simulated. The memory structure simulation process of the present invention thus improves the efficiency of the optimization process by improving the overall performance of the circuit simulations used therein.

Referring now to FIG. 3, a diagram of a memory structure of a circuit for simulation is shown. FIG. 3 depicts a memory structure 300 of a circuit (hereafter circuit 300) including a first register 301, second register 302, third register 303, and fourth register 304. Registers 301–304 each include eight memory elements (e.g., flip-flops) as shown, and are thus configured to store an 8-bit byte of a 32 bit word. Registers 301–304 have respective inputs 331–334 for writing data to their memory elements. Inputs 331–334 are coupled to receive data from an input bus 308. Registers 301–304 also have respective outputs 341–344. Outputs 341–342 couple to logic block 310. Outputs 343–344 couple to logic block 320.

As described above, in one embodiment the present invention is implemented as a software based EDA process for efficiently simulating memory structures of a sequential circuit for design verification of the sequential circuit. Circuit 300 is instantiated within the context of an EDA circuit simulation process executing on, for example, CAD system 112 of FIG. 1, by accessing an HDL netlist description of the circuit. In this embodiment, a gate level netlist description is used for the verification simulation.

To avoid having to simulate each memory element of each of registers 301–304 individually, the memory elements included within the description are identified, and for these memory elements, inputs to the memory elements and outputs from the memory elements are identified. Using this information, the memory elements are grouped into groups of functionally related memory elements.

Thus, for example, the memory elements of register 301 are grouped together based upon the function relationship apparent from the common input 331 and the common output 341. Similarly, memory elements of registers 302–304 are grouped together based on the functional relationship of inputs 332–334 and outputs 342–344 respectively. The grouping operation results in four groups 301–304 (e.g., the memory registers) of memory elements.

Subsequently, the memory elements of the groups 301–304 are collectively addressed as a group. For example, during the simulation process, address information is written to group 301 as an eight bit word as opposed to individual bits. Similarly, data for the memory elements of 301 is collectively written as an eight bit word. This provides for a much more efficient update of the simulation in comparison to individual updates of each memory element.

Once written, the data written to, for example group 301, is coupled to circuit elements within the description that are coupled to the outputs of the memory elements, in this case, logic block 310. Thus, the data written into group 301 is subsequently asserted to logic block 310 such that the memory elements are efficiently simulated group-wise, as opposed being simulated individually.

In so doing, a more efficient process and system for design verification for sequential circuits is implemented. For those circuits having a very large number of memory elements, the simulation process of the present invention provides a significant savings in the amount of processing time (e.g., CPU cycles) required to run the simulation. Accordingly, using the simulation process of the present invention, even those circuits having a very large number of possible states can be simulated, and the design of the circuits can be accurately verified within reasonable time constraints.

Different grouping configurations of memory elements are possible, as determined by the specific layout of the circuit being verified. For example, as opposed to grouping memory elements into four groups corresponding to registers 301–304, the memory elements can be grouped into two groups corresponding to the relationship of outputs 341–342 which couple to logic block 310, and outputs 343–344 which couple to logic block 320. In this case, a first group would include the memory elements of registers 301–302 and a second group would include the memory elements of registers 303–304.

Referring now to FIG. 4, a flow chart of the steps of a process 400 in accordance with one embodiment of the present invention is shown. Process 400 shows the operating steps of a memory structure simulation program as implemented in a CAD system (e.g., CAD system 112 of FIG. 1).

Process 400 begins in step 401, where a netlist description of an integrated circuit is accessed by the memory structure simulation program of the present invention executing on CAD system 112. As described above, the netlist description represents the integrated circuit device to be realized in physical form. The netlist description is a gate-level netlist description of the circuit elements of the integrated circuit device.

In step 402, the simulation program identifies the memory elements contained within the netlist description. The simulation program parses the netlist description to identify memory storage elements capable of storing state information.

In step 403, once the memory elements are identified in step 402, the simulation program examines the memory elements to identify the inputs to the memory elements. The simulation program examines the circuit structure coupled to the memory elements to identify the particular inputs to the memory elements.

In step 404, the outputs from the memory elements are identified. In the same manner as in step 403, the simulation program examines the circuit structure coupled to the memory elements to identify the outputs from the memory elements.

In step 405, the simulation program groups the memory elements into functionally related groups as determined by their respective inputs and outputs. As described above, using the information regarding the coupled circuit structure obtained in steps 403 and 404, the memory elements are grouped based upon their functional relationship to one another.

In step 406, once grouped, the memory elements are simulated by addressing them collectively on a groupwise basis. This allows the memory elements to be addressed by the simulation program much more efficiently than addressing them individually.

In step 407, the grouped memory elements are written to collectively. As described above, this allows the state of the memory elements to be updated using entire words of data, as opposed to individual bits.

In step 408, once the storage state of the memory elements has been updated, the data written to the groups of memory elements is coupled to the output circuit structures connected to the memory elements. Hence, once updated, the data is dispersed to the circuit structures within the netlist description that are coupled to the outputs of the memory elements.

Thus, the present invention provides an efficient method and system for design verification for complex integrated circuits having a very large number of possible states. The present invention provides an efficient method and system for simulating an integrated circuit having a large number of memory elements. Additionally, the present invention provides a system which can efficiently process and update the memory elements of a simulation of an integrated circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for efficiently simulating memory structures of a sequential circuit for design verification of the sequential circuit, the method implemented by a computer system having a processor coupled to a memory via a bus, the memory storing computer readable code which when executed by the processor cause the computer system to perform the steps of:

accessing a netlist description of a sequential circuit, the description for realizing the sequential circuit in a physical form;

identifying memory elements included within the description;

identifying inputs to the memory elements;

identifying outputs from the memory elements;

grouping the memory elements into at least one group by analyzing the inputs and the outputs to determine functionally related memory elements for the group;

addressing the memory elements of the group collectively;

writing data to the memory elements of the group collectively;

coupling the data collectively written to the memory elements of the group to circuit elements within the description that are coupled to the outputs of the memory elements such that the memory elements are efficiently simulated;

examining circuit structure coupled to the memory elements to identify inputs to the memory elements; and examining circuit structure coupled to the memory elements to identify outputs from the memory elements.

2. The method of claim 1 wherein the functionally related memory elements comprise a register.

3. The method of claim 1 wherein collectively addressing and writing to the memory elements of the group are performed on a per-clock cycle basis.

4. An efficient memory structure simulation method for simulating the operation of a sequential circuit, the method implemented by a computer system having a processor coupled to a memory via a bus, the memory storing computer readable code which when executed by the processor cause the computer system to perform the steps of:

accessing a netlist description of a sequential circuit, the description for realizing the sequential circuit in a physical form;

identifying memory elements included within the description;

examining circuit structure coupled to the memory elements to identify inputs to the memory elements;

examining circuit structure coupled to the memory elements to identify outputs from the memory elements;

grouping the memory elements into a plurality of groups by analyzing the inputs and the outputs to determine functionally related memory elements for the groups;

addressing the memory elements of each of the groups collectively;

writing data to the memory elements of each of the groups collectively; and coupling the data collectively written to the memory elements of each of the groups to circuit elements within the description that are coupled to the outputs of the memory elements such that the memory elements are efficiently simulated.

5. The method of claim 4 wherein one of the groups of functionally related memory elements comprise a register.

6. The method of claim 4 wherein one of the groups of functionally related memory elements comprise a buffer.

7. The method of claim 4 wherein collectively addressing and writing to the memory elements of each of the groups are performed on a per-clock cycle basis.

8. A system for efficiently simulating memory structures of a sequential circuit for design verification of the sequential circuit, comprising:

a computer system having a processor coupled to a memory via a bus, the memory storing computer readable code which when executed by the processor cause the computer system to perform the steps of:

accessing a netlist description of a sequential circuit, the description for realizing the sequential circuit in a physical form;

identifying memory elements included within the description;

identifying inputs to the memory elements;

identifying outputs from the memory elements;

grouping the memory elements into at least one group by analyzing the inputs and the outputs to determine functionally related memory elements for the group;

addressing the memory elements of the group collectively;

writing data to the memory elements of the group collectively;

coupling the data collectively written to the memory elements of the group to circuit elements within the description that are coupled to the outputs of the memory elements such that the memory elements are efficiently simulated;

examining circuit structure coupled to the memory elements to identify inputs to the memory elements; and examining circuit structure coupled to the memory elements to identify outputs from the memory elements.

9. The system of claim 8 wherein the functionally related memory elements comprise a register.

10. The system of claim 8 wherein collectively addressing and writing to the memory elements of the group are performed on a per-clock cycle basis.

\* \* \* \* \*